(12) United States Patent
Mu (10) Patent No.: US 10,320,341 B2
(45) Date of Patent: Jun. 11, 2019

(54) AMPLIFIER (71) Applicant: Telefonaktiebolaget LM Ericsson (publ), Stockholm (SE)

(72) Inventor: Fenghao Mu, Hjarup (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 104 days.

(21) Appl. No.: 15/316,562

(22) PCT Filed: May 2, 2016

(86) PCT No.: PCT/EP2016/059791
§ 371 (c)(1),
(2) Date: Dec. 6, 2016

(87) PCT Pub. No.: WO2017/190764
PCT Pub. Date: Nov. 9, 2017

(65) Prior Publication Data
US 2018/0191312 A1    Jul. 5, 2018

(51) Int. Cl.
*H03F 1/34* (2006.01)
*H03F 3/45* (2006.01)
(Continued)

(52) U.S. Cl.
CPC ............ *H03F 1/342* (2013.01); *H03F 3/195* (2013.01); *H03F 3/45179* (2013.01);
(Continued)

(58) Field of Classification Search
USPC ................................ 330/302, 305, 311, 254
See application file for complete search history.

(56) References Cited

U.S. PATENT DOCUMENTS 7,949,322 B2    5/2011 Kim et al.
8,212,615 B2 *  7/2012 Masuda ............... H03G 3/3052
                                                         330/254
(Continued)

FOREIGN PATENT DOCUMENTS

EP    2624448 A1    8/2013
GB    2490979 A    11/2012

OTHER PUBLICATIONS

Donggu Im et al., A CMOS Active Feedback Balun-LNA With High IIP2 for Wideband Digital TV Receivers, IEEE Transactions on Microwave Theory and Techniques, vol. 58, No. 12, Dec. 2010, 14 pages.
(Continued)

*Primary Examiner* — Hieu P Nguyen
(74) *Attorney, Agent, or Firm* — Leffler Intellectual Property Law, PLLC (57) ABSTRACT An amplifier for a receiver circuit is disclosed. The amplifier has an input node ($V_{in}$) and an output node ($V_{out}$). It comprises a tunable tank circuit connected to the output node ($V_{out}$), a feedback circuit path connected between the output node ($V_{out}$) and the input node ($V_{in}$), and a tunable capacitor connected between an internal node of the feedback circuit path and a reference-voltage node. A receiver circuit and a communication apparatus is disclosed as well.

16 Claims, 6 Drawing Sheets (51) Int. Cl.
    *H03F 3/195* (2006.01)
    *H04B 1/18* (2006.01)
    *H04B 1/16* (2006.01)
    *H04B 1/00* (2006.01)

(52) U.S. Cl.
    CPC ............ *H04B 1/1638* (2013.01); *H04B 1/18* (2013.01); *H03F 2200/144* (2013.01); *H03F 2200/21* (2013.01); *H03F 2200/222* (2013.01); *H03F 2200/294* (2013.01); *H03F 2200/451* (2013.01); *H03F 2200/546* (2013.01); *H03F 2203/45024* (2013.01); *H03F 2203/45236* (2013.01); *H03F 2203/45241* (2013.01); *H03F 2203/45512* (2013.01); *H03F 2203/45524* (2013.01); *H03F 2203/45526* (2013.01); *H04B 1/0053* (2013.01); *H04B 1/0082* (2013.01)

(56) References Cited

U.S. PATENT DOCUMENTS

| | | |
|---|---|---|
| 8,306,494 B2 | 11/2012 | Ojo |
| 2006/0208802 A1 | 9/2006 | Minichshofer |
| 2009/0039964 A1 | 2/2009 | Hijikata et al. |
| 2011/0102088 A1 | 5/2011 | Rajendran et al. |
| 2012/0068769 A1 | 3/2012 | Wang et al. |

OTHER PUBLICATIONS

PCT International Search Report, dated Jan. 17, 2017, in connection with International Application No. PCT/EP2016/059791, all pages.

\* cited by examiner

AMPLIFIER

TECHNICAL FIELD

The present invention relates to an amplifier circuit.

BACKGROUND

Radio receiver circuits are used in many different applications, such as cellular communications. Signals received by a radio receiver circuit may be relatively weak and need to be amplified. Hence, an amplifier is typically included in the radio receiver circuit. Such an amplifier should not add too much noise to the received signal. Therefore, a so called low-noise amplifier (LNA) is often used for this purpose.

Some existing radio communications systems, such as fourth generation (4G) and fifth generation (5G) cellular communications systems, the used signal bandwidth is often relatively large, such as tens or hundreds of MHz. Furthermore, it should be possible to tune a receiver center frequency over a relatively large frequency range. One challenging task in the design of receiver amplifiers, such as LNAs, is to achieve an input impedance matching with enough frequency bandwidth. Such relatively wideband input impedance matching should preferably be obtained while at the same reaching sufficiently high performance in terms of other parameters of the LNA, such as gain and frequency selectivity.

SUMMARY

Embodiments of the present invention concern an amplifier, such as an LNA, for a receiver circuit, having a tunable tank circuit, such as an LC circuit, connected to an output node of the amplifier. Such a tank circuit can provide a desired degree of frequency selectivity. Embodiments of the amplifier further comprise a feedback network between the output node and an input node. Such a feedback network can facilitate in providing input impedance matching. The inventor has realized that the phase of the output voltage, generated at the tank circuit, changes relatively abruptly around the resonance frequency of the tank circuit. The relatively abruptly changed phase has an impact on the feedback, and makes it challenging to meet input impedance matching requirements. For example, maximum gain of the amplifier and best input impedance matching may occur at different frequencies, which is undesired. Hence, some type of tuning is needed. The inventor has realized that a relatively efficient tuning can be obtained by connecting a feedback circuit path of the feedback network between the output node and the input node, and by connecting a tunable capacitor between an internal node of the feedback circuit path and a reference voltage node, such as ground or signal ground. An advantage of this approach is that the tunability can be obtained with components, such as the tunable capacitor, with relatively low Q value. Such components are normally easier and cheaper to manufacture than components with higher Q value.

According to a first aspect, there is provided an amplifier for a receiver circuit. The amplifier has an input node and an output node. The amplifier comprises a tunable tank circuit connected to the output node. Furthermore, the amplifier comprises a feedback circuit path connected between the output node and the input node. Moreover, the amplifier comprises a tunable capacitor connected between an internal node of the feedback circuit path and a reference-voltage node.

In some embodiments, the feedback circuit path is a passive circuit.

The feedback circuit path may comprise a series connection of at least one resistor and at least one capacitor.

In some embodiments, the at least one resistor is tunable. This facilitates an even further degree of fine tuning of the input impedance.

In some embodiments, said at least one capacitor comprises a first capacitor, and said at least one resistor comprises a first resistor connected between the output node and the first capacitor and a second resistor connected between the first capacitor and the input node. Said internal node may be a node between the first capacitor and the second resistor.

The amplifier may comprise a first transistor in common-source configuration. Furthermore, the amplifier may comprise a second transistor connected in a cascode configuration between the first transistor and the output node.

According to a second aspect, there is provided a differential amplifier for a receiver circuit, comprising a first and a second amplifier according to any preceding claim. The first and second amplifier may share some components, such as the tank circuit.

According to a third aspect, there is provided a receiver circuit comprising an amplifier according to the first aspect or a differential amplifier according to the second aspect.

According to a fourth aspect, there is provided a communication apparatus comprising the receiver circuit according to the third aspect.

The communication apparatus may be a wireless communication device for a cellular communication network. The communication apparatus may be a radio base station for a cellular communication network.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
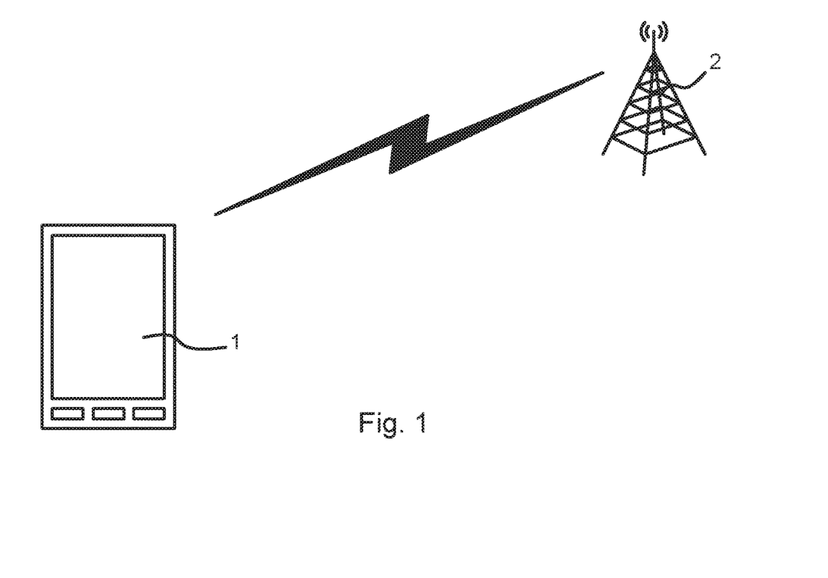
FIG. 1 illustrates a communication environment.

FIG. 1 illustrates an environment in which embodiments of the present invention may be employed. In FIG. 1, a wireless communication device 1 is in wireless communication with a base station 2 of a cellular communication system. In FIG. 1, the wireless communication device 1 is illustrated as a mobile phone. However, this is only an example. The wireless communication device may be any kind of device equipped with cellular communication capabilities, such as a table computer, laptop computer, cellular modem, or machine-type communication (MTC) device. The wireless communication device 1 and base station 2 are examples of what in this disclosure is referred to as communication apparatuses. It should be noted that other communication apparatuses than cellular communication apparatuses, such as terminals and access points for wireless local area networks (WLANs), are possible as well within the scope of the present disclosure.

Figure 2:
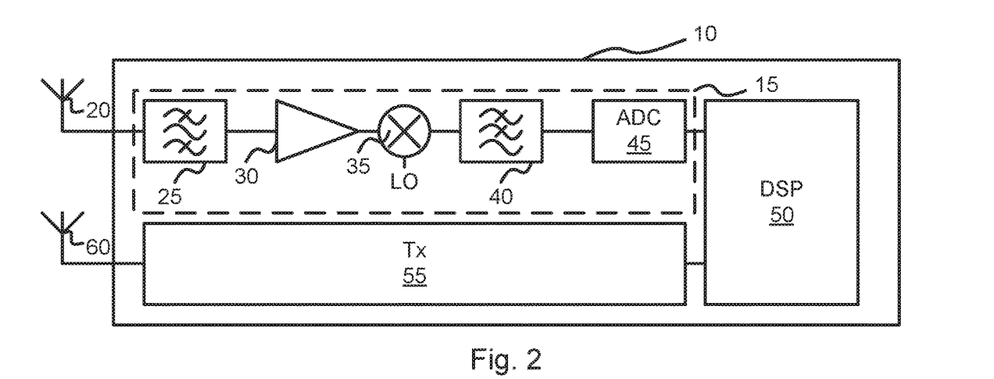
FIG. 2 illustrates a transceiver circuit.

According to embodiments of the present disclosure, a communication apparatus, such as those described above, comprises a receiver circuit. The receiver circuit may e.g. be part of a transceiver circuit. FIG. 2 illustrates an example of such a transceiver circuit 10. In FIG. 2, the transceiver circuit 10 comprises a receiver circuit 15, arranged to be connected to an antenna 20. In FIG. 2, the receiver circuit 15 comprises a radio frequency (RF) filter 25 arranged to be connected to the antenna 20. In some embodiments, the RF filter 25 is a band-pass filter. Furthermore, in FIG. 2, the receiver circuit 15 comprises an amplifier 30. Embodiments of the amplifier 30 are described in more detail below. The amplifier 30 may e.g. be what is commonly referred to as an LNA. In FIG. 2, the receiver circuit comprises a down-conversion mixer 35, driven by a local oscillator (LO) signal, connected to an output node of the amplifier 30. The down-conversion mixer 35 is configured to down convert the RF signal output from the amplifier 30 to a baseband frequency or intermediate frequency. Furthermore, in FIG. 2, the receiver circuit 15 comprises a filter 40 arranged to filter out unwanted signal components from the down-converted signal output from the mixer 35. In some embodiments, the filter 40 is a low-pass filter. Moreover, in FIG. 2, the receiver circuit 15 comprises an analog-to-digital converter (ADC) 45 configured to convert the filtered down-converted signal output from the filter 40 to the digital domain.

As illustrated in FIG. 2, the transceiver circuit 10 may comprise a digital signal processor (DSP) 50, such as a baseband processor, configured to process the digital output signal from the ADC 45, e.g. to recover received data.

As also illustrated in FIG. 2, the transceiver circuit 10 may comprise a transmitter circuit 55, arranged to be connected to an antenna 60 for transmitting RF signals. The DSP 50 may be configured to generate input data to the transmitter circuit 55.

The diagram of the receiver circuit 15 is merely an example used to put embodiments of the amplifier 30 in a context. Embodiments of the amplifier 30 may be used in other receiver architectures as well. It should be mentioned that embodiments of the amplifier 30 may be integrated on an integrated circuit, e.g. together with some or all of the other components of the receiver circuit 15.

Figure 3:
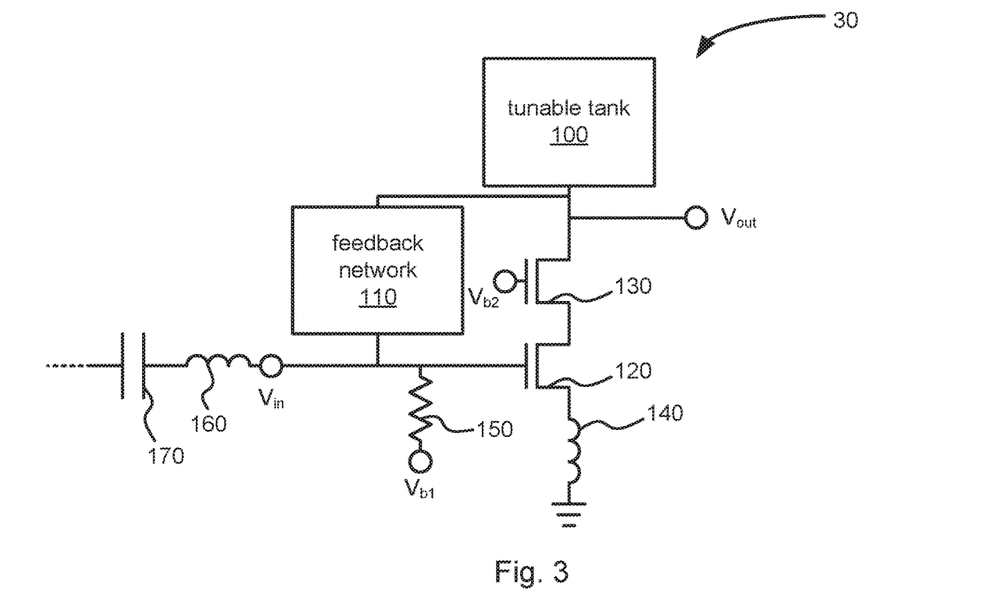
FIGS. 3-7 shows circuit diagrams of amplifier circuits.

FIG. 3 illustrates an embodiment of the amplifier 30. In FIG. 3, the amplifier 30 has an input node $V_{in}$ and an output node $V_{out}$. Furthermore, it comprises a tunable tank circuit 100 connected to the output node $V_{out}$. Moreover it comprises a feedback network 110 between the output node $V_{out}$ and the input node $V_{in}$. In order to provide amplification, an active element, such as a transistor, is generally used in an amplifier. The embodiment of the amplifier 30 illustrated in FIG. 3 comprises a MOS (Metal-Oxide-Semiconductor) transistor 120 in common-source configuration. In FIG. 3, the gate terminal of the transistor 120 is connected to the input node $V_{in}$. Other types of transistors, such as bipolar junction transistors (BJTs) are possible as well. Moreover, in FIG. 3, the amplifier 30 comprises a MOS transistor 130 connected in a cascode configuration between the transistor 120 and the output node $V_{out}$. The gate terminal of the transistor 130 is connected to a bias voltage node $V_{b2}$. In some embodiments, the cascode transistor 120 may be omitted. Other embodiments may include more than one cascode transistor.

As illustrated in FIG. 3, the amplifier 30 may comprise a source-degeneration inductor 140, connected between the source of transistor 120. It may also comprise a biasing resistor 150 connected between the input node $V_{in}$ and a bias voltage node $V_{b1}$. FIG. 3 also illustrates some reactive components, such as an inductor 160 and a capacitor 170, connected in series with the inductor 160 between the input node $V_{in}$ and preceding components, such as the filter 25 (FIG. 2). Such reactive components 160, 170 facilitate the input impedance matching for the amplifier 30.

Figure 4:
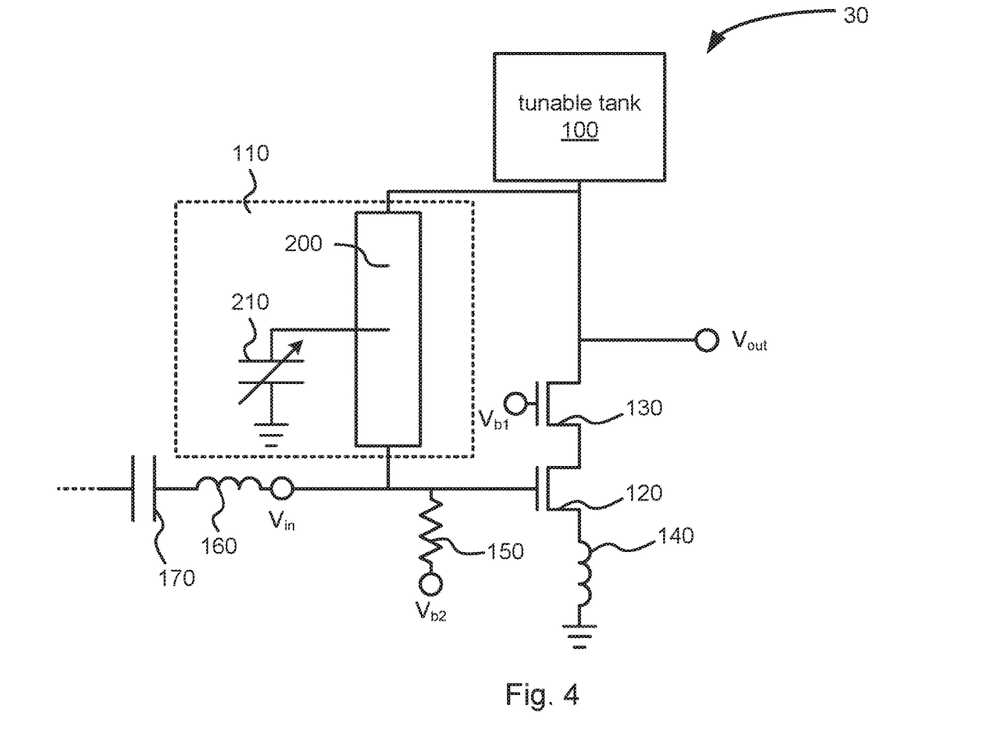

The inventor has realized that the phase of output voltage, generated at the tank circuit, changes relatively abruptly around the resonance frequency of the tank circuit. The relatively abruptly changed phase has an impact on the feedback, and makes it challenging to meet input impedance matching requirements. It may be particularly challenging in applications with relatively high bandwidth, such as in the GHz range, and with relatively high carrier frequencies, such as several tens of GHz, e.g. as will likely be used for 5G systems in the future. For example, maximum gain of the amplifier and best input impedance matching may occur at different frequencies, which is undesired. Hence, some type of tuning is needed. FIG. 4 illustrates an advantageous implementation of the feedback network 110 provided by the inventor. It comprises a feedback circuit path 200 connected between the output node $V_{out}$ and the input node $V_{in}$. Furthermore, it comprises a tunable capacitor 210 connected between an internal node of the feedback circuit path 200 and a reference-voltage node, such as ground or signal ground.

The tunable capacitor 210 facilitates compensation of the relatively abruptly changed phase of the output voltage around the resonance frequency of the tank circuit 100. It enables tuning of the amplifier 30 such that, for instance, the maximum gain of the amplifier 30 and the best input impedance matching of the amplifier 30 can be tuned, in frequency, to occur at substantially the same frequency. Furthermore, simulations have shown that the capacitor 210 can be implemented with a relatively low Q value, while still providing this desired tunability. This is advantageous, since the tunability can be obtained at a relatively low cost with relatively small components.

The inventor has further realized that the feedback circuit path 200 can be implemented as a passive circuit. Using a passive feedback circuit path makes it relatively easy to obtain a combination of relatively high gain and stability, which can be a very challenging design goal if an active feedback circuit path would be used. Furthermore, a passive feedback circuit typically does not require any complex biasing circuit. Nevertheless, a desired input impedance matching can be obtained also in embodiments with active components in the feedback circuit path.

Figure 5:
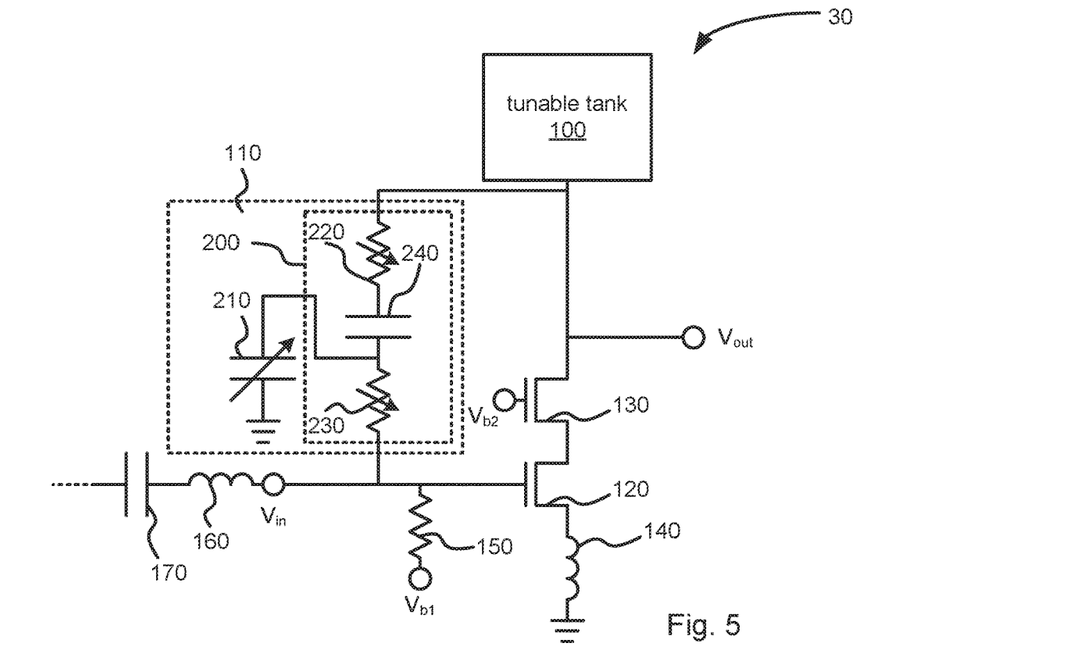

For example, the feedback circuit path can be implemented using a series connection of at least one resistor and at least one capacitor. This is illustrated in FIG. 5 with an embodiment wherein said at least one capacitor comprises a first capacitor 240, and said at least one resistor comprises a first resistor 220 connected between the output node $V_{out}$ and the first capacitor 240 and a second resistor 230 connected between the first capacitor 240 and the input node $V_{in}$. Furthermore, in FIG. 5, the internal node, to which the capacitor 210 is connected, is a node between the first capacitor 240 and the second resistor 230.

As illustrated in FIG. 5, the at least one resistor (e.g., 220, 230) can be tunable as well. This provides a further degree of tunability to facilitate tuning of the input impedance implemented with relatively cheap and small components.

Figure 6:
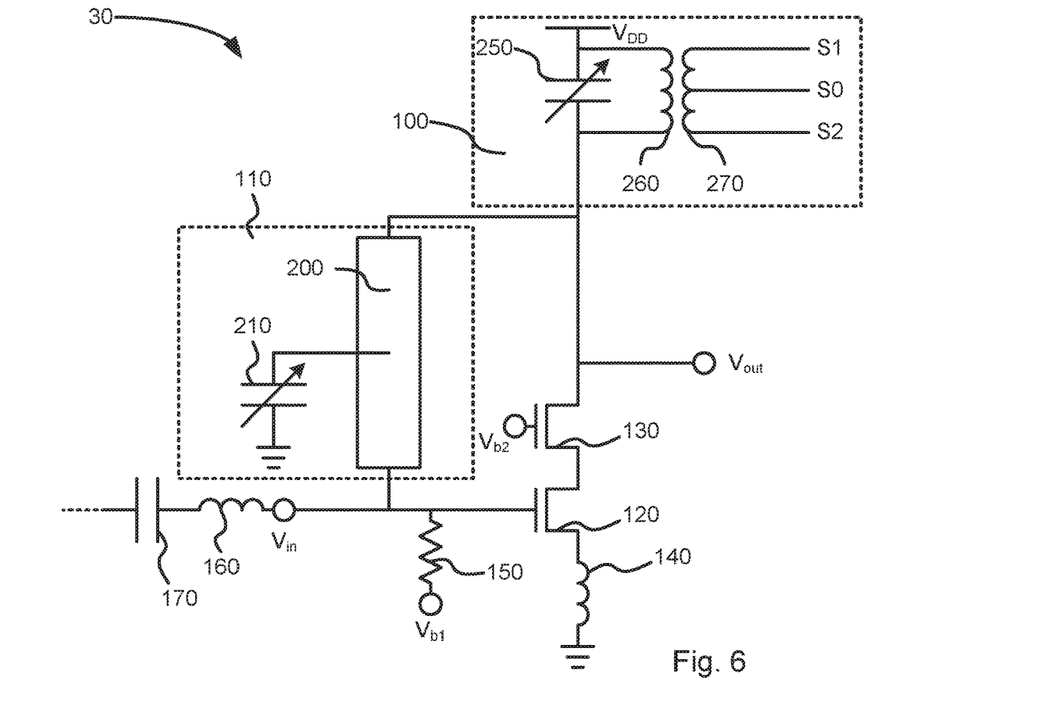

FIG. 6 illustrates an embodiment of the tunable tank circuit 100. As can be seen from FIG. 6, the tunable tank circuit 100 may comprise a parallel LC circuit, comprising a capacitor 250 connected in parallel with an inductor 260. As is further illustrated in FIG. 6, the tunability of the tank circuit 100 can be provided by making the capacitor 250 tunable, whereby the resonance frequency of the tank circuit 100 can be tuned. Preferably, the resonance frequency of the tank circuit is tuned to around the center frequency of a desired signal frequency band.

As is further illustrated in FIG. 6, the tank circuit 100 may comprise another inductor 270 magnetically coupled to the inductor 260 with a mutual inductance M. Such a solution can provide a desired overall inductance of the tank circuit with smaller inductor coils compared with embodiments where the inductor 260 is used alone, without the additional inductor 270. Inductors 260 and 270 forms a primary and secondary winding, respectively, of a transformer. In an example embodiment, nodes S1 and S2 of inductor 270 are used to drive subsequent stages in the receiver circuit 15, whereas node S0 is connected to a bias voltage node.

Figure 7:
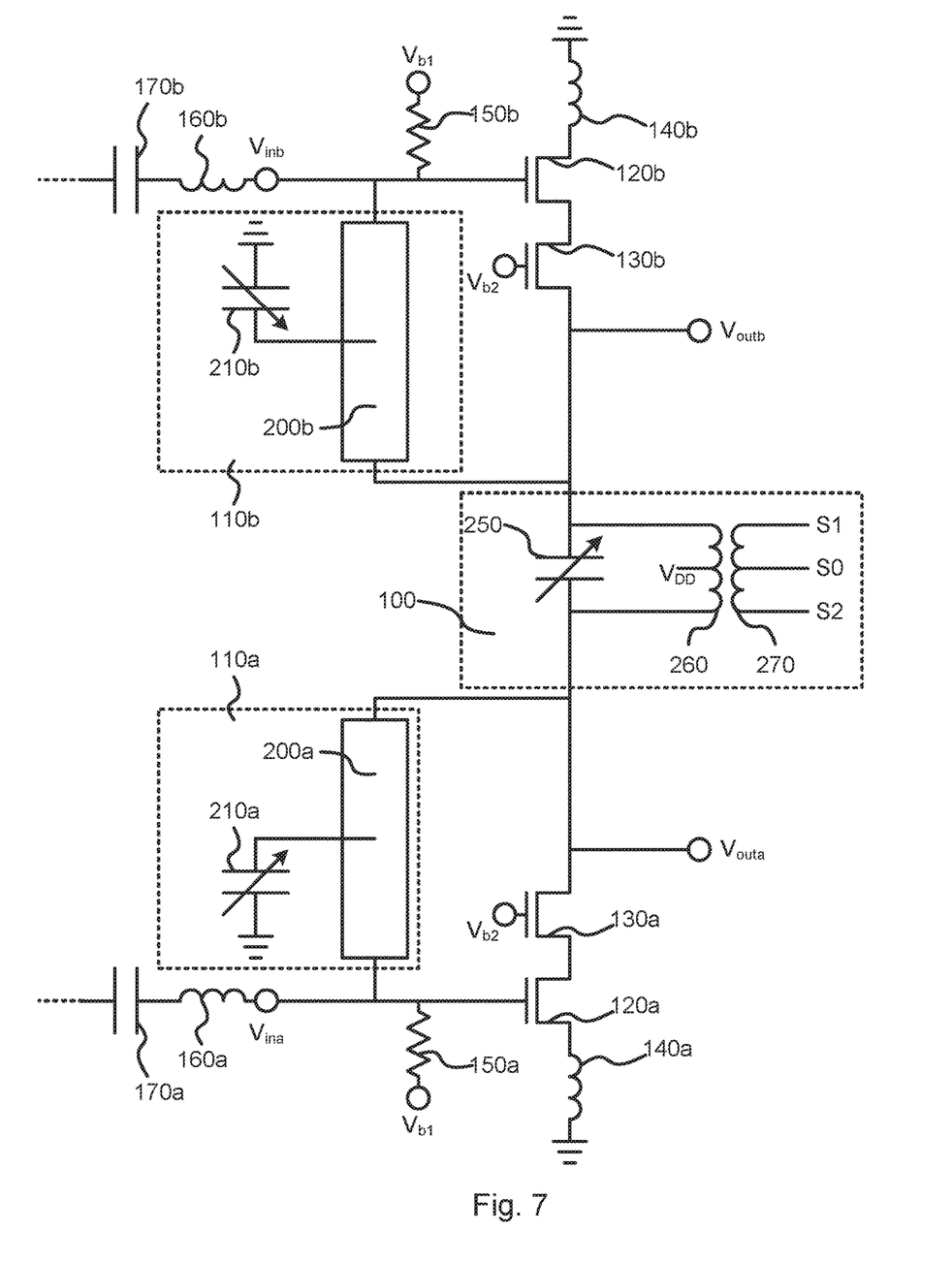

According to some embodiments, two of the amplifiers 30 are combined into a differential amplifier. Such a differential amplifier can, of course, be used in a receiver circuit, e.g. as a differential LNA. An example of such an embodiment is illustrated in FIG. 7. The embodiment of the differential amplifier illustrated in FIG. 7 can be seen as a differential version of the embodiment of the amplifier 30 illustrated in FIG. 6. Components 110a, 120a, 130a, 140a, 150a, 160a, 170a, 200a, and 210a, correspond to the components 110, 120, 130, 140, 150, 160, 170, 200, and 210 (FIG. 6) of a first one of the two amplifiers making up the differential amplifier. Similarly, components 110b, 120b, 130b, 140b, 150b, 160b, 170b, 200b, and 210b, correspond to the components 110, 120, 130, 140, 150,160, 170, 200, and 210 (FIG. 6) of a second one of the two amplifiers making up the differential amplifier. In FIG. 7, the differential amplifier comprises a shared tank circuit 100. However, in other embodiments, there may be separate tank circuits for the two amplifiers making up the differential amplifier. The nodes $V_{ina}$ and $V_{inb}$) make up a differential input port. Similarly, the output nodes $V_{outa}$ and $V_{outb}$ make up a differential output port.

Figure 8:
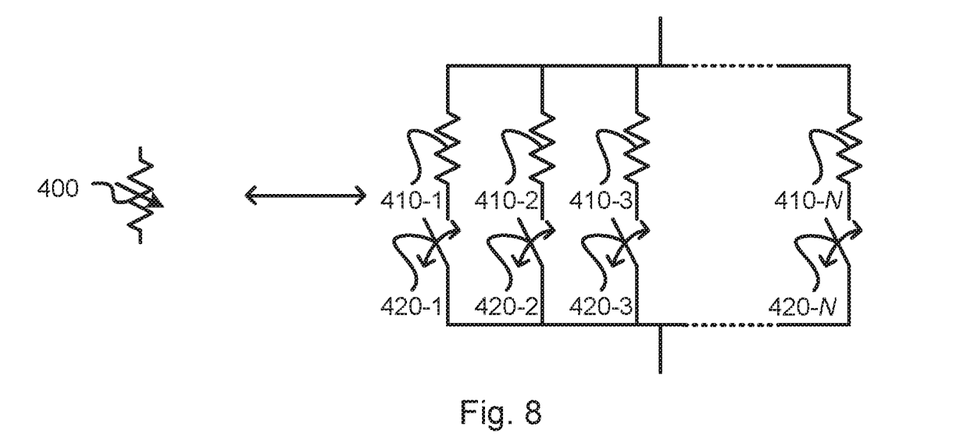
FIG. 8 illustrates implementation of a tunable resistor.

FIG. 8 illustrates a possible implementation of a tunable resistor 400. It illustrates that a tunable resistor 400 can be implemented with a number of parallel-connected switchable resistors, each comprising a resistor 410-$i$ in series with a switch 420-$i$. By selecting which of the switches 420-$i$ are closed and which are open, the total resistance of the tunable resistor 400 can be tuned to a desired value, as would be readily understood by a person skilled in electronic circuit design. The switches 420-$i$ can e.g. be controlled with a digital control word, where each bit of the control word controls a unique one of the switches 420-$i$. Any of the tunable resistors discussed in this disclosure can be designed in this way.

Figure 9:
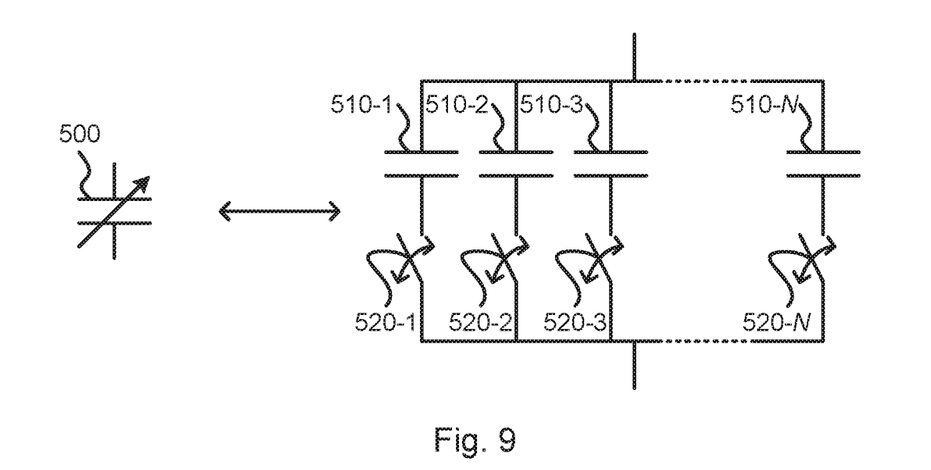
FIG. 9 illustrates implementation of a tunable capacitor.

In a similar way, FIG. 9 illustrates a possible implementation of a tunable capacitor. It illustrates that a tunable capacitor 500 can be implemented with a number of parallel-connected switchable capacitors, each comprising a capacitor 510-$i$ in series with a switch 520-$i$. By selecting which of the switches 520-$i$ are closed and which are open, the total capacitance of the tunable capacitor 500 can be tuned to a desired value, as would be readily understood by a person skilled in electronic circuit design. The switches 520-$i$ can e.g. be controlled with a digital control word, where each bit of the control word controls a unique one of the switches 520-$i$. Any of the tunable capacitors discussed in this disclosure can be designed in this way.

Figure 10:
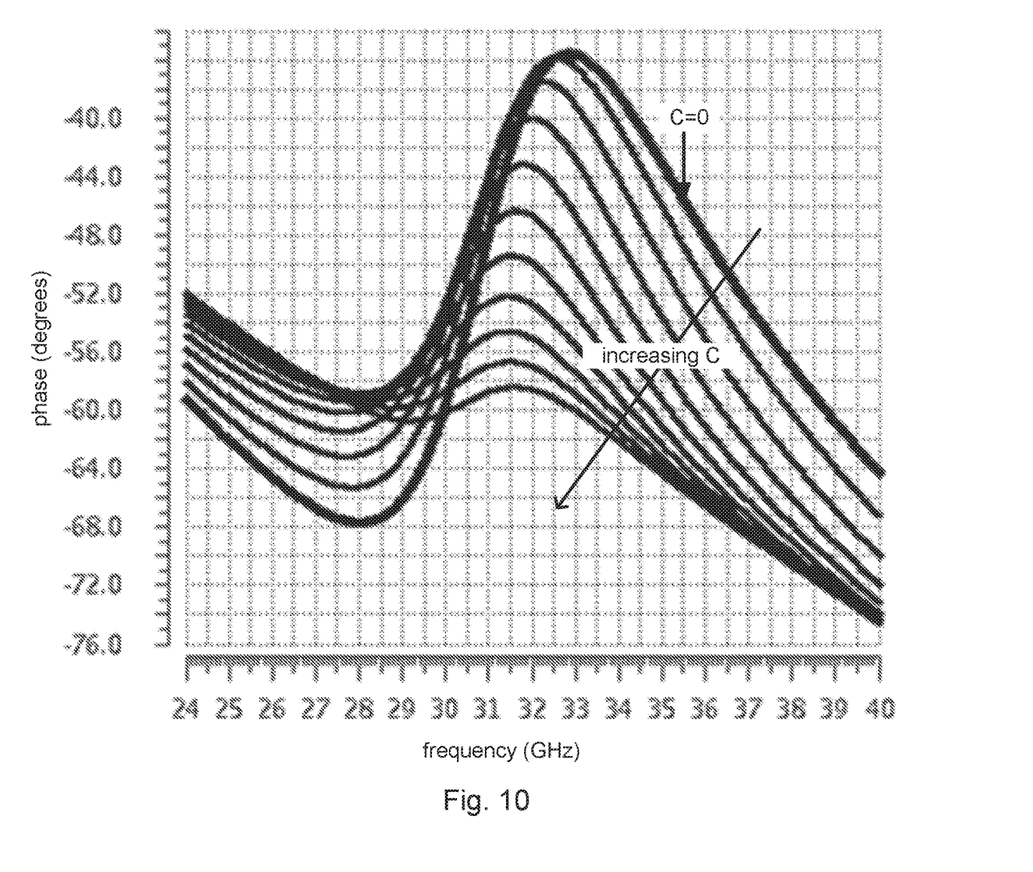
FIG. 10 shows simulation results.

FIG. 10 illustrates how the phase of the feedback current, from the feedback network 110, into the input node $V_{in}$ varies with frequency and capacitance C of the capacitor 210 according to a simulation example. In the simulation example, the circuit topology of FIG. 5 has been used, and an RF AC voltage source with a 50Ω output resistance has been used to feed the left node of the capacitor 170. The quantitative behavior of the curve naturally depends on component parameter values for the circuit components. Selection of such component parameter values for a given requirement specification, e.g. based on circuit simulation, is considered a routine task for a person skilled in the art of analog RF circuit design and is not discussed herein in any further detail. An interesting observation, in the context of this disclosure, that can be made from FIG. 10 is the qualitative behavior of the curves. One of the curves is labeled C=0. This case, where the capacitance C of the capacitor 210 is 0, corresponds to a case where the capacitor 210 is absent. It can be observed that there is a relatively abrupt phase variation around the resonance frequency to the tank circuit 100, which in this simulation is around 30 GHz. This relatively abrupt phase variation makes it difficult to achieve a good input impedance matching over more than a relatively narrow frequency range. Furthermore, the best input impedance matching may occur at another frequency than the resonance frequency of the tank circuit 100, in particular in applications where the receiver circuit 15 is tunable to different frequency bands and, therefore, the tank circuit 100 is tunable to different resonance frequencies. As the value of C is increased, it can be observed that the phase variation is reduced, which enables input impedance matching over a wider frequency range. Furthermore, it is possible to tune the value of C such that the best, or at least an adequately good, input impedance matching is provided at the center frequency of the tank circuit 100. As mentioned above, such tuning can be obtained using tunable components with relatively low Q value.

The present invention has been described above with reference to specific embodiments. However, other embodiments than the above described are possible within the scope of the disclosure. The different features of the embodiments may be combined in other combinations than those described.

The invention claimed is:

1. An amplifier for a receiver circuit, the amplifier having an input node ($V_{in}$) and an output node ($V_{out}$), comprising
   a tunable tank circuit connected to the output node ($V_{out}$);
   a feedback circuit path connected between the output node ($V_{out}$) and the input node ($V_{in}$); and
   a tunable capacitor connected between an internal node of the feedback circuit path and a reference-voltage node,
   wherein the feedback circuit path comprises a series connection of at least one resistor and at least one capacitor.

2. The amplifier according to claim 1, wherein the feedback circuit path is a passive circuit.

3. The amplifier according to claim 1, wherein the at least one resistor is tunable.

4. The amplifier according to claim 1, wherein said at least one capacitor comprises a first capacitor, said at least one resistor comprises a first resistor connected between the output node ($V_{out}$) and the first capacitor and a second resistor connected between the first capacitor and the input node ($V_{in}$).

5. The amplifier according to claim 4, wherein the internal node is a node between the first capacitor and the second resistor.

6. The amplifier according to claim 1, comprising a first transistor in common-source configuration.

7. The amplifier according to claim 6, comprising a second transistor connected in a cascode configuration between the first transistor and the output node ($V_{out}$).

8. A differential amplifier for a receiver circuit, comprising a first and a second amplifier, each according to claim 1.

9. A receiver circuit comprising an amplifier according to claim 1.

10. A communication apparatus comprising the receiver circuit according to claim 9.

11. The communication apparatus according to claim 10, wherein the communication apparatus is a wireless communication device for a cellular communication network.

12. The communication apparatus according to claim 10, wherein the communication apparatus is a radio base station for a cellular communication network.

13. A receiver circuit comprising the differential amplifier of claim 8.

14. A communication apparatus comprising the receiver circuit according to claim 13.

15. The communication apparatus according to claim 14, wherein the communication apparatus is a wireless communication device for a cellular communication network.

16. The communication apparatus according to claim 14, wherein the communication apparatus is a radio base station for a cellular communication network.

* * * * *